United States Patent
Sekine et al.

(10) Patent No.: US 9,383,648 B2
(45) Date of Patent: Jul. 5, 2016

(54) ANTI-COUNTERFEITING MARKER SHEET AND MANUFACTURING METHOD THEREFOR, ANTI-COUNTERFEITING FUNCTION-IMPARTING MEMBER, AND ARTICLE PROVIDED WITH ANTI-COUNTERFEITING FUNCTION

(71) Applicant: DAI NIPPON PRINTING CO., LTD., Tokyo (JP)

(72) Inventors: Yoko Sekine, Tokyo (JP); Tsuyoshi Yamauchi, Abiko (JP); Mitsuru Kitamura, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/357,705

(22) PCT Filed: Nov. 9, 2012

(86) PCT No.: PCT/JP2012/079096
§ 371 (c)(1),
(2) Date: May 12, 2014

(87) PCT Pub. No.: WO2013/073462
PCT Pub. Date: May 23, 2013

(65) Prior Publication Data
US 2014/0319815 A1    Oct. 30, 2014

(30) Foreign Application Priority Data

Nov. 14, 2011    (JP) .................................. 2011-248273

(51) Int. Cl.
*B42D 25/42*    (2014.01)
*G03F 7/20*    (2006.01)
(Continued)

(52) U.S. Cl.
CPC ............... *G03F 7/2024* (2013.01); *B41M 3/14* (2013.01); *B42D 15/0013* (2013.01);
(Continued)

(58) Field of Classification Search
CPC ....................................................... B42D 25/42
USPC ....................................... 283/74, 93; 162/140
See application file for complete search history.

(56) References Cited

U.S. PATENT DOCUMENTS

| | | | |
|---|---|---|---|
| 6,309,690 B1 * | 10/2001 | Brogger et al. .................... | 427/7 |
| 6,708,618 B1 * | 3/2004 | Tsai ................................. | 283/93 |
| 8,840,146 B2 | 9/2014 | Stalder | |
| 2008/0129036 A1 * | 6/2008 | Seki et al. ........................ | 283/67 |

FOREIGN PATENT DOCUMENTS

| | | |
|---|---|---|
| CN | A-102214412 | 10/2011 |
| EP | 1 932 679 A1 | 12/2007 |

(Continued)

OTHER PUBLICATIONS

Translation of WO2010/054671 (May 2010).*
(Continued)

*Primary Examiner* — Kyle Grabowski
(74) *Attorney, Agent, or Firm* — Oliff PLC

(57) ABSTRACT

The purpose of the invention is to obtain an anti-counterfeiting marker sheet that is inexpensive and with which authenticity can be assessed easily. The invention uses an anti-counterfeiting marker sheet (1) characterized in being provided with a substrate (3), and multiple markers (5), which are formed directly on the substrate (3) and the contour shape of which can be recognized by magnified examination. It is preferable that: the markers are not unevenly distributed but are irregularly disposed on the substrate; there are multiple marker (5) colors; and there are multiple types of shapes for the marker (5) contour shapes. It is also preferable that the minimum radius of curvature of the corners of the shapes formed when the markers (5) are viewed in plan view is 250 nm to less than 10 μm.

18 Claims, 11 Drawing Sheets

(51) Int. Cl.
*B41M 3/14* (2006.01)
*C09J 7/02* (2006.01)
*B42D 25/29* (2014.01)
*B42D 15/00* (2006.01)

(52) U.S. Cl.
CPC .............. *B42D 25/29* (2014.10); *B42D 25/42* (2014.10); *C09J 7/0296* (2013.01); *G03F 7/20* (2013.01); *B42D 2033/20* (2013.01); *B42D 2035/34* (2013.01); *B42D 2035/44* (2013.01); *C09J 2203/338* (2013.01)

(56) References Cited

FOREIGN PATENT DOCUMENTS

| EP | 1 953 684 A1 | | 1/2008 | |
|----|---|---|---|---|
| JP | A-2002-230512 | | 8/2002 | |
| JP | 2008230228 | * | 10/2008 | ............ B42D 15/10 |
| JP | A-2009-536883 | | 10/2009 | |
| JP | 4775727 | | 9/2011 | |
| WO | WO2010054671 | * | 5/2010 | |
| WO | WO 2010054671 A1 | | 5/2010 | |

OTHER PUBLICATIONS

Feb. 5, 2013 International Search Report issued in PCT/J2012/079096 (with English Translation).

Feb. 14, 2014 International Preliminary Report on Patentability issued in PCT/JP2012/079096 (with English Translation).

Nov. 4, 2014 Office Action issued in Chinese Office Application No. 201280055919.X with English Translation.

Oct. 20, 2014 Extended European Search Report issued in European Patent Application No. 12849158.6.

* cited by examiner (a)

(b)

(a)

(b)

(c)

(a)

(b)

(c)

(d)

(e)

(a)

(b)

(c)

(d)

(e)

(a)

(b)

ANTI-COUNTERFEITING MARKER SHEET AND MANUFACTURING METHOD THEREFOR, ANTI-COUNTERFEITING FUNCTION-IMPARTING MEMBER, AND ARTICLE PROVIDED WITH ANTI-COUNTERFEITING FUNCTION

FIELD OF THE INVENTION

This invention relates to anti-counterfeiting marker sheets that can be provided onto cards such as credit cards, cash cards, ID cards, and membership cards, valuable papers and cash vouchers such as paper money, stock certificates, gift vouchers, lottery tickets, bills, checks, and admission tickets, identifications of all kinds, tags for expensive merchandise, and the like.

BACKGROUND OF THE INVENTION

Conventionally, an anti-counterfeiting additive called "taggant" (or "taggent") has been used to prevent articles such as valuable papers from counterfeiting. The taggant is required to be inexpensive and highly difficult to be counterfeited. It is also required that the authenticity can be assessed easily and quickly.

Such taggant particles are disclosed as patterned markers that are made to be recognizable under optical magnifying apparatus. These markers are formed either by a lithography method, which is in the technical field of integrated circuits, or by other methods, which are in the technical field of micro machining. The markers are formed so that they can be recognized with information based on the designs such as shapes, logos, personal signatures, dates, and words. The markers can be fixed by adhering and drying liquid adhesive, which is mixed uniformly with these markers, onto a surface of a document and the like (See Patent Document 1).

PRIOR ART DOCUMENTS

Patent Documents

[Patent Document 1] Japanese Unexamined Patent Application Publication No. 2002-230512 (JP-A-2002-230512)

SUMMARY OF THE INVENTION

Problems to be Solved by the Invention

However, the conventional method of adhering and drying of liquid with the dispersed markers has a problem: it is difficult to form a recognition part for authenticity assessment that includes appropriate number and types of markers uniformly. There are cases in which the recognition part for authenticity assessment does not include any markers, or include only a few markers or only particular shaped markers when a variety of shapes are expected; the markers are distributed unevenly or a plurality of markers are overlapped so that it is difficult to be read.

The conventional method also has a problem that the shapes of the markers are destroyed and the recognition function does not work when handling the markers, especially dispersing the markers into the liquid to produce ink. Furthermore, the conventional method has another problem: it costs to produce a soluble layer on a substrate, to form the markers on the soluble layer, and to eventually dissolve the soluble layer to particles. It is also costly to produce ink by dispersing the markers into liquid as well as to apply the ink.

Means for Solving Problems

The present invention was achieved in view of such problems. Its object is to obtain an anti-counterfeiting marker sheet that is inexpensive and with which authenticity can be assessed easily.

To achieve the above object, the following inventions are provided.

(1) An anti-counterfeiting marker sheet comprising a substrate and a plurality of markers that are formed directly on the substrate by using photolithography in which the contour shapes of the markers can be recognized by magnified examination.

(2) The anti-counterfeiting marker sheet according to (1) above in which the markers are distributed evenly and disposed irregularly on the substrate.

(3) The anti-counterfeiting marker sheet according to (1) above in which there are a plurality of colors of the markers.

(4) The anti-counterfeiting marker sheet according to (1) above in which the contour shapes of the markers have a plurality of types of shapes.

(5) The anti-counterfeiting marker sheet according to (1) above in which shapes that can be recognized by magnified examination are formed inside the markers.

(6) The anti-counterfeiting marker sheet according to (1) above in which the minimum radius of curvature of the corner part of a shape that is formed when the markers are plan viewed is 250 nm or more and less than 10 μm.

(7) An anti-counterfeiting function-imparting member comprising an anti-counterfeiting marker sheet comprising a substrate and a plurality of markers that are formed directly on the substrate by using photolithography in which the contour shapes can be recognized by magnified examination and the substrate is laminated with at least an attachment layer and a release paper.

(8) An article provided with anti-counterfeiting function having an anti-counterfeiting marker sheet comprising a substrate and a plurality of markers that are formed directly on the substrate by using photolithography in which the contour shapes can be recognized by magnified examination.

(9) A manufacturing method for anti-counterfeiting marker sheet, comprising the steps of applying photosensitive resin on a substrate to form a photosensitive resin layer, exposing light on the photosensitive resin layer through a photo mask, and developing the photosensitive resin layer to form markers of which the contour shapes can be recognized by magnifying examination.

(10) The manufacturing method for anti-counterfeiting marker sheet according to (9) above, comprising the steps of laminating the substrate on a base plate before the applying step and releasing the substrate, on which the markers are formed, from the base plate after the developing step.

(11) The manufacturing method for anti-counterfeiting marker sheet according to (9) above in which there are a plurality of colors of the markers and each of the applying, exposing, and developing steps are repeated with each color using the respectively colored photosensitive resin.

Effects of the Invention

The present invention can provide an anti-counterfeiting marker sheet which is inexpensive and with which authenticity can be assessed easily.

BRIEF DESCRIPTION OF THE DRAWINGS

FIG. 5 (b) is a partially sectional view of an anti-counterfeiting transfer foil 31 in accordance with an embodiment of the present invention.

FIG. 6 (b) is a sectional view of line A-A' line in FIG. 6 (a).

FIG. 7 (b) is a sectional view of line B-B' line in FIG. 7 (a).

DETAILED DESCRIPTION OF THE PREFERRED EMBODIMENTS

The Structure of a Marker Sheet 1

With reference to the drawings, a marker sheet 1 in accordance with an embodiment of an embodiment of the present invention will be described hereinafter.

Figure 1:
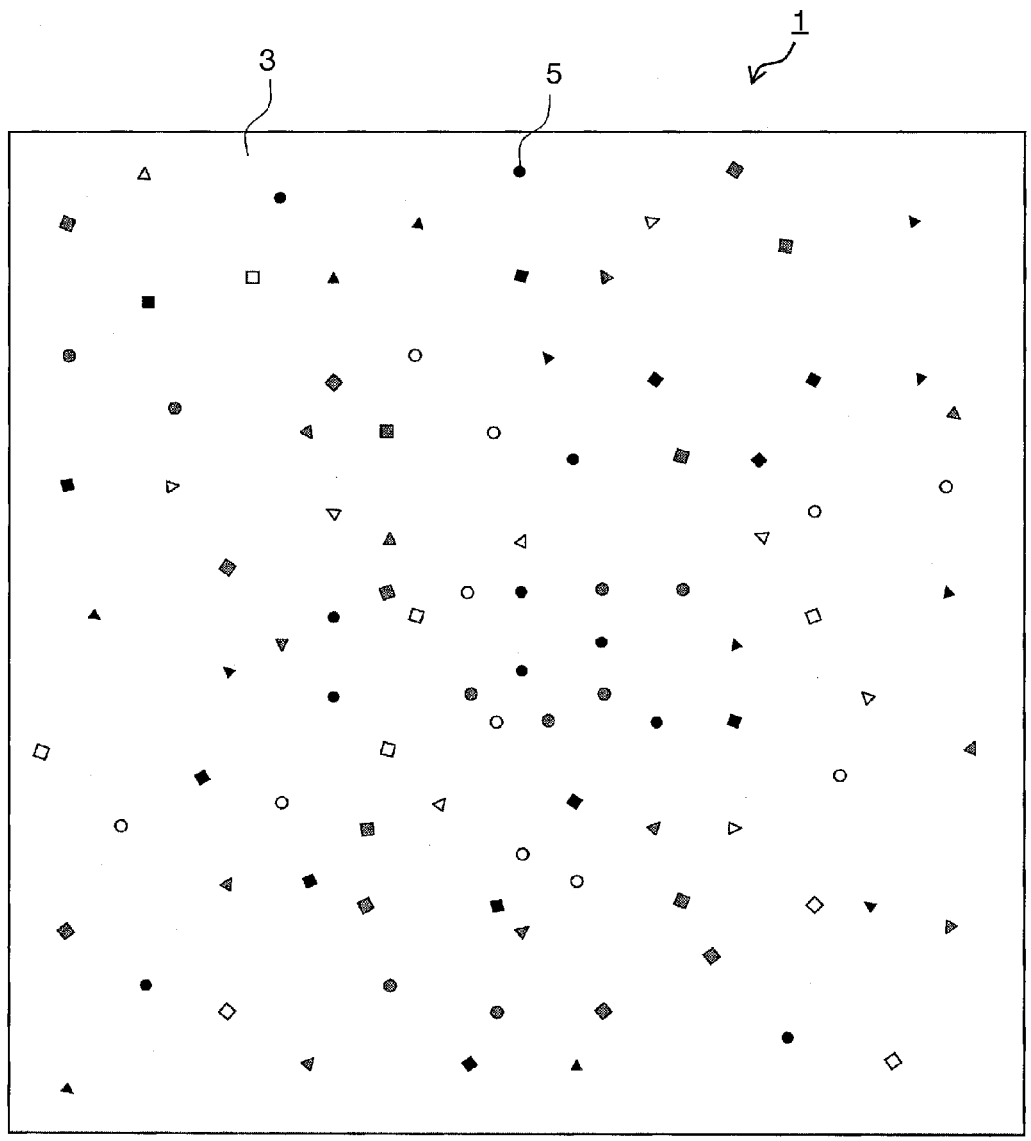
FIG. 1 is a plan view of a marker sheet 1 in accordance with an embodiment of the present invention.

FIG. 1 is a plan view of the marker sheet 1. The marker sheet 1 comprises a substrate 3 and a plurality of markers 5 that are formed directly on the substrate 3. The shapes of the markers 5 can be recognized by magnified examination. Also, the markers 5 are evenly distributed and are irregularly disposed on the substrate 3.

The marker sheet 1 in accordance with an embodiment of the present invention can include an appropriate number and types of markers 5 evenly since the markers 5 are formed directly on the substrate 3 by means of photolithography or printing as described below.

Also, by forming the markers 5 directly on the substrate 3, the marker sheet 1 in accordance with an embodiment of the present invention does not include an ink-producing process in which markers are released from the substrate to be particulates that are then dispersed into liquid to make ink. Therefore, the shapes of the markers are prevented from being destroyed in the ink-producing process.

Also, for the marker sheet 1 in accordance with an embodiment of the present invention, the markers 5 are formed directly adhering to the substrate 3. On the other hand, in a conventionally case in which the markers are applied after dispersed in liquid adhesive and the like, a resin layer including markers is formed on a substrate. The marker sheet in the present invention therefore can make the marker-attached part thinner than the conventional marker sheet. "The markers 5 are formed directly on the substrate 3." means that the markers 5 are formed directly in contact with the substrate 3. The substrate 3 may include a treatment layer on the surface thereof on which the markers 5 are formed such as to enhance adhesion. The markers 5 are still considered to be formed directly on the substrate 3 even if the markers 5 are formed on the treatment layer.

Also, since the markers 5 are formed directly on the substrate 3 for the marker sheet 1 of the present invention, a sacrificing layer that is supposed to be formed between the markers and the substrate to release the marker from the substrate is unnecessary. Also, compared to the conventional invention, the marker sheet can be made at low cost since the ink producing process that disperses the markers into liquid and applying process that applies the ink produced are no longer necessary.

The material for the substrate 3 is not particularly limited. However, considering that the substrate 3 is to be pasted onto other articles with the markers 5 to be read, it is preferable that the substrate 3 is a transparent resin film of polyethyleneterephthalate (PET), polypropylene (PP), polycarbonate (PC) or polyethylene (PS) having a thickness of 100 μm or less.

Figure 2:
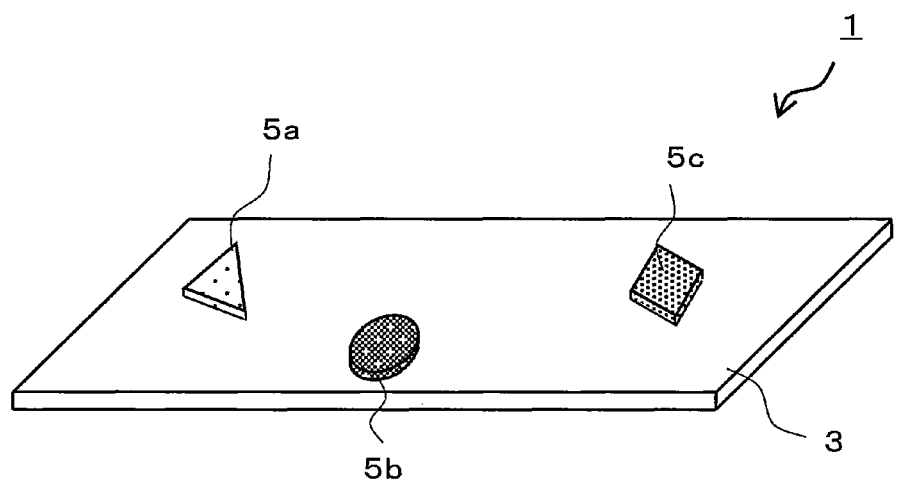
FIG. 2 is an enlarged perspective view of the marker sheet 1 in accordance with an embodiment of the present invention.

The markers 5 are approximately flat plate shaped and can be recognized when the contour shapes thereof are observed under magnified examination. That is, recognition is possible by observing the magnified contour of the base. FIG. 2 is an enlarged perspective view of the marker sheet 1. As shown in FIG. 2, the marker sheet 1 contains a triangular plate-like marker 5a, a circular plate-like marker 5b, and a square plate-like marker 5c as markers 5. The markers 5a, 5b, and 5c have different colors respectively. The contour shapes of the markers 5 are not limited to these shapes, but can be various shapes such as elliptical, polygonal, star-shaped, heart-shaped, or outlined shapes of animals, numbers, symbols, and signs.

"Recognition of the shapes is possible." means that the shapes are formed artificially and can be distinguished from the naturally formed shapes. Therefore, when an article attached with the marker sheet 1 is to be counterfeited, it may be possible to reproduce the external form and the like of the article but it is difficult to reproduce the markers 5 so that the genuine article can be distinguished from the counterfeited one. Also, since recognition of the shapes is possible, the period of production, the intended purpose, and the like can be distinguished even between genuine articles by changing the shapes of the markers 5 which are to be attached.

Also, markers 5 are colored by using pigments, dyes, and the like. Coloring the markers 5 improves design property and anti-counterfeiting effect. As shown in FIG. 2, the marker sheet 1 contains the markers 5a to 5c of three different colors.

Also, "markers 5 are evenly distributed on the substrate 3" means that the distribution of the markers 5 within the surface of the authenticity recognition part is not significantly uneven but is uniform to an extent that it does not arise any problems for recognition purpose. Also, "makers 5 are irregularly disposed on the substrate 3" means that the markers 5 are disposed so to make the directions, the relative positions, and the number density of the markers are non-regular. The markers 5 are produced by photolithography and the like as described below to be disposed irregularly. Unlike the conventional method of applying markers in distribution liquid in which the distribution of the markers is naturally made to be non-regular, a mask such as a photo mask having a pattern of irregularly positioned markers is formed in the present invention. Also, if the contour shapes of the markers 5 are outlined shapes of letters or inner shapes are letters such as marker 5i, recognition is difficult when the markers are turned over. In a conventional method of applying the marker distribution liquid, markers are sometimes turned over resulting in difficulty of recognition. However, in the present invention, since the markers 5 are directly formed on the substrate 3, there is no such case that the markers 5 are turned over, so that it is easy to recognize letters and the like.

In the photo mask exposure, although only one same pattern is formed by one exposure, different patterns can be formed by exposures of each color of the markers 5 with different rotation angles or the shifted positions of the photo mask.

The marker sheet 1 in accordance with an embodiment of the present invention has the markers 5 disposed evenly and irregularly, so that a particular article can have markers of particular shapes, colors, size, numbers, and arrangement. Therefore, the marker sheet 1 can be used for an identification purpose by checking information of the markers 5.

Materials for the markers 5 are not particularly limited but, from a view point of design and endurance properties, resist materials such as color resist or dry film resist (DFR), offset inks of pigments and dyes, or a silkscreen ink are preferable.

The thickness of the markers 5 is preferably between 0.1 μm and 25 μm. If the thickness is too small, manufacturing becomes difficult. If the thickness is too large on the other hand, not only the formation of the thick photosensitive resin film in manufacturing process becomes difficult, but the markers 5 is easily peeled off from the substrate 3.

The size of the markers 5 is preferably between 3 μm to 300 μm. If the size is too small, it is not possible to observe the markers 5 with a simple magnifying apparatus such as a magnifying glass and authenticity can be assessed only by using a complex apparatus such as a microscope. Also, if the size is too large, the characteristics of the markers 5 are recognizable with naked eyes without using a magnifier and the anti-counterfeiting effect is impaired. Since the markers 5 are plate-like shaped, the thickness is preferably half or less than the size. Here, the size is the maximum length when the marker 5 is plan viewed. For example, if the shape is a square, the size is the length of its diagonal line; and if the shape is an ellipse, then the size is the length of its major axis.

It is difficult to know that an article attached with the marker sheet 1 in accordance with an embodiment of the present invention is provided with an anti-counterfeiting technique since the markers 5 cannot be recognized by naked eyes but can be recognized only by using apparatus such as a magnifying glass. Therefore, markers 5 can provide an enhanced anti-counterfeiting effect compared to the visually recognizable anti-counterfeiting technology.

Preferably, the minimum radius of curvature of the corner part of a shape that is formed when the marker 5 is plan viewed is 250 nm or more and less than 10 μm. This corner part is the sharpest part of the shape of the marker 5, and is the part such as an intersection of two straight lines, a straight line and a curved line, two curved lines, or the like. It is difficult to manufacture markers 5 with the high resolution like this by offset printing and intaglio printing described in the fourth embodiment of the present invention below. However, it is possible to manufacture the markers 5 with the high resolution by the other methods using photolithography and inkjet printing as described below.

Figure 13:
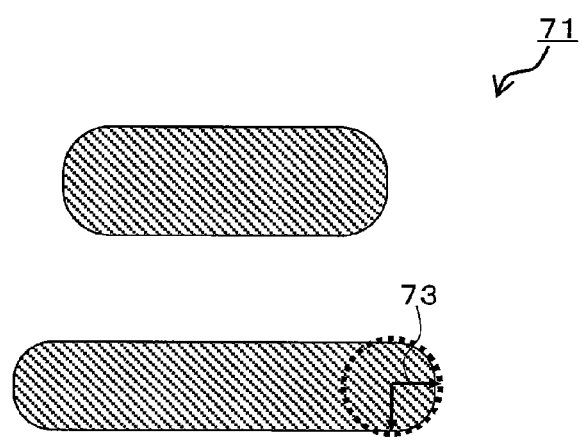
FIG. 13 shows a radius of curvature of a corner part of a microscopic letter.

The microscopic letters printed on the back of a thousand yen note by a conventional method, such as offset printing or intaglio printing, are examined. For example, a microscopic letter of a Japanese character "ni" has two horizontal bars. It is impossible to make the corners of the bars exactly 90 degrees whatever method of manufacturing is used, and the corners are always rounded off to a certain extent. The radius of the curvature 73 of a corner part of a microscopic letter 71 in FIG. 13 showing a character "ni" on the back of a thousand yen note is approximately 58 μm.

Generally, if offset printing or intaglio printing is used, the size of a dot is 35 μm even with a high definition printing called 720 lines (720 dots per inch). If even a higher resolution is possible, still the minimum size of a pixel formed is 20 μm and the radius of curvature of the corner is 10 μm at the minimum.

If offset printing or intaglio printing in the fourth method for manufacturing the markers in accordance with an embodiment of the present invention is used, the radius of curvature of a corner is 1 to 50 μm because of the characteristic of ink.

On the other hand, if inkjet printing in the fourth method is used, a dot having a radius of 1 μm or less can be formed and the radius of curvature of the corner can be 500 nm.

Also, the first to third methods of manufacturing using photolithography can record a latent image with a resolution up to the wavelength of exposing light so that a shape having a maximum diameter of 500 nm can be formed if an exposing light having a wavelength of 365 nm is used.

That is, the radius of curvature can be 250 nm in the present invention. Also, since it is possible to form a graphical shape with a line width of twice the radius of curvature at the minimum, a minute microscopic letter having a line width of 500 nm and a letter size of 3 μm can be formed if the radius of curvature is 250 nm.

Also, even if the letter size is 300 μm, the radius of curvature of a corner is still small and minute shape production is possible so that the anti-counterfeiting property can be improved.

As described above, the conventional technology of making markers into particles destroys the corners of the markers when producing ink. However, the markers in accordance with an embodiment of the present invention can have corners having smaller radii of curvature maintaining minute shapes.

Figure 3:
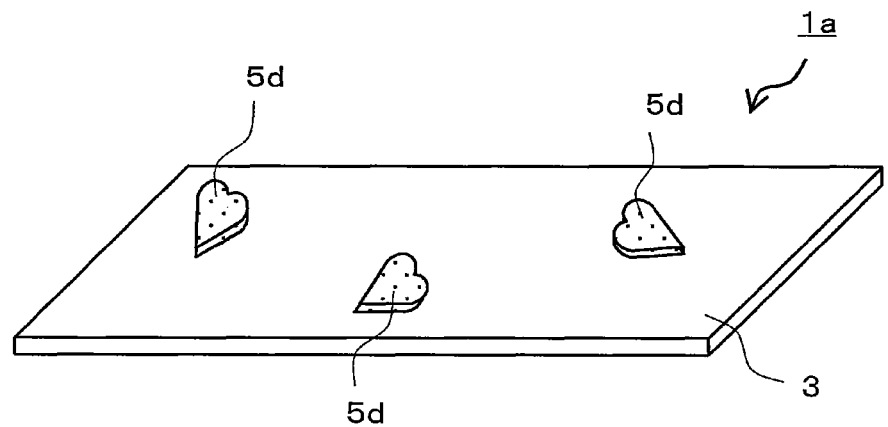
FIGS. 3 (a)-(c) are enlarged perspective views illustrating maker sheets 1a-1c.
Figure 3:
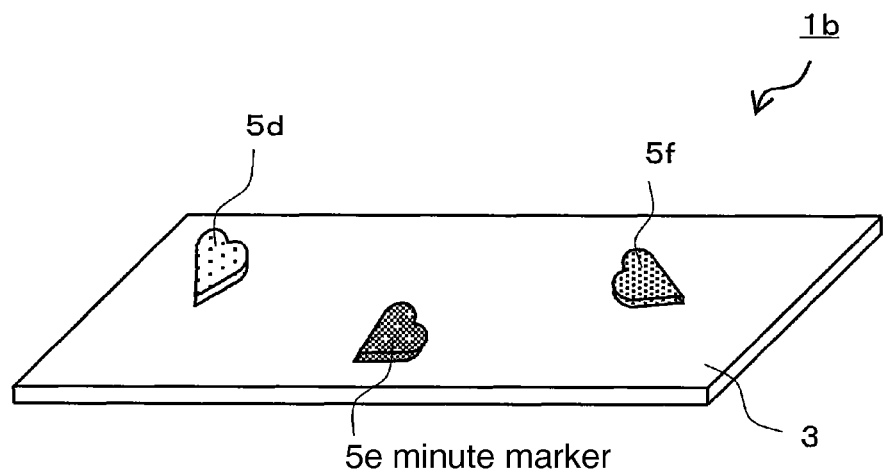
Figure 3:
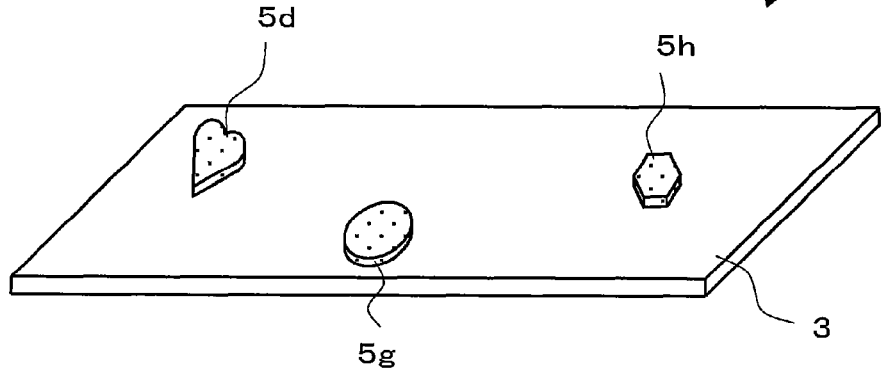

The marker sheet 1 having markers 5a-5c of different shapes and colors is described in FIG. 2. However, depending on the usage, a marker sheet may include, for example, a plurality of marker 5d of the same shape and color on the substrate 3 like a marker sheet 1a in FIG. 3(a). Also, a marker sheet may include markers 5d, 5e, 5f of the same shape and different colors on the substrate 3 like a marker sheet 1b in FIG. 3(b). Furthermore, a marker sheet may include markers 5d, 5g, 5h of the different shapes and the same color on the substrate 3 like a marker sheet 1c in FIG. 3(c). Especially, such marker sheet 1a and 1c having only single colored markers can be manufactured at low cost since it is not necessary to repeat forming the markers for the number of different colors.

Figure 4:
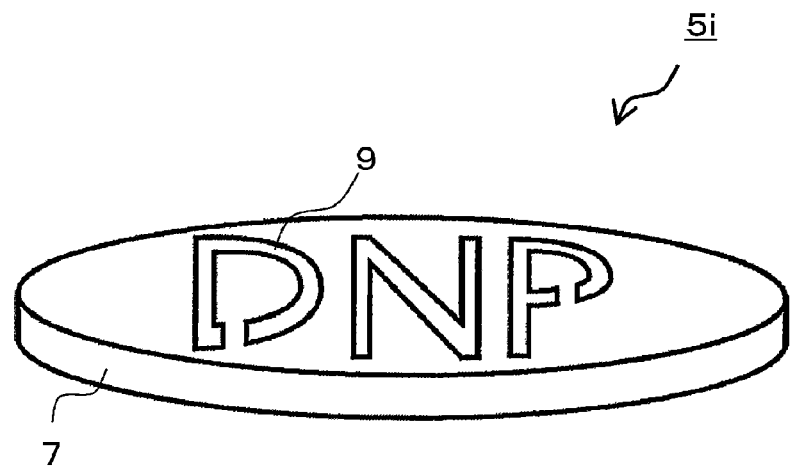
FIG. 4 is a perspective view of a marker 5i in accordance with an embodiment of the present invention.

Also, like a marker 5i shown in FIG. 4, the inner shape of the marker 5 can be recognized by magnified examination. The marker 5i has a circular plate like base plate 7 with letters "DNP" formed on the penetration part 9. The contour shape of the base plate 7 is not limited to the circular plate, but can be elliptical, polygonal, heart-shaped, star-shaped, or outline of animals, letters, numbers, symbols, and graphics, and the like. Also, as well as letters, a variety of numbers, symbols, graphics, and the like can be taken as the shape of the penetration part 9.

(The Usage of the Marker Sheet 1)

An anti-counterfeiting function-imparting member in accordance with an embodiment of the present invention can be obtained by laminating at least an attachment layer and a release paper on the marker sheet in accordance with an embodiment of the present invention. Examples are an anti-counterfeiting label 21 and an anti-counterfeiting transfer foil 31. The attachment layer is an adhesive layer 23, a heat seal agent layer 33, or the like that shows an adhesive or attachment power in a general or particular environment.

By peeling off the release paper and attaching the anti-counterfeiting function-imparting member in accordance with an embodiment of the present invention to an article, the marker sheet in accordance with an embodiment of the present invention can easily be attached to the article and the article can be imparted with the anti-counterfeiting function.

Figure 5:
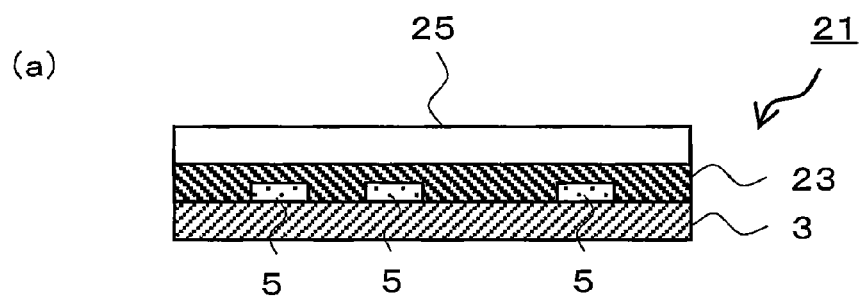
FIG. 5 (a) is a partially sectional view of an anti-counterfeiting label 21 in accordance with an embodiment of the present invention.
Figure 5:
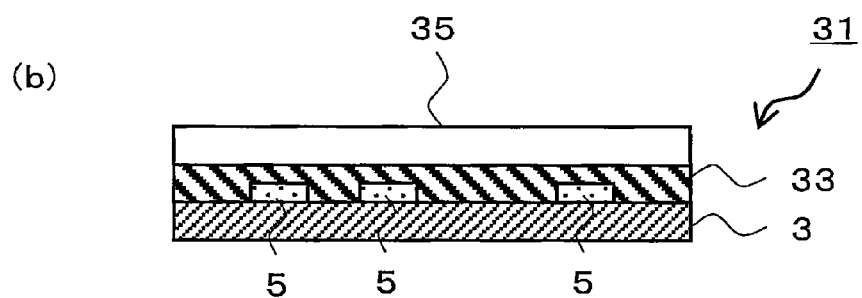

As shown in FIG. 5 (*a*), the anti-counterfeiting label 21 can be obtained by laminating the adhesive layer 23 and a release paper 25 on the surface on which the markers 5 of the marker sheet 1 are formed or on the surface opposite to the surface on which the markers 5 of the marker sheet 1 are formed. The adhesive layer 23 is formed by applying common adhesive to the marker sheet 1 or by attaching the adhesive layer 23 supported by the release paper 25 to the marker sheet 1.

As shown in FIG. 5 (*b*), the anti-counterfeiting transfer foil 31, which can fix the marker sheet 1 to an article, can be obtained by laminating the heat seal agent layer 33 and a release paper 35 on the surface on which the markers 5 of the marker sheet 1 are formed or on the surface opposite to the surface on which the markers 5 of the marker sheet 1 are formed. The heat seal agent layer 33 is formed by applying common heat seal agent, of which adhesive power increases when heated, to the substrate 3 or by attaching the heat seal agent layer 33 supported by the release paper 35 to the marker sheet 1.

Also, an article provided with anti-counterfeiting function can be obtained by attaching the marker sheet in accordance with an embodiment of the present invention to the article using the anti-counterfeiting function-imparting member in accordance with an embodiment of the present invention or the like. Examples for articles provided with anti-counterfeiting function are card 41 and valuable paper 51.

For the article provided with anti-counterfeiting function in accordance with an embodiment of the present invention, although it may be possible to reproduce the outline shape or the like of the article, reproduction of the marker sheet 1 is difficult so that the genuine article and the counterfeited article can be distinguished. Also, since each of the articles provided with anti-counterfeiting function in accordance with an embodiment of the present invention has the marker sheet 1 having a unique pattern, it is possible to distinguish between an article having the marker sheet 1 of a first pattern and an article having the marker sheet 1 of a second pattern. Furthermore, articles provided with anti-counterfeiting function in accordance with an embodiment of the present invention can be used as an artifact metrics identification by associating the pattern of the marker sheet 1 to database.

Figure 6:
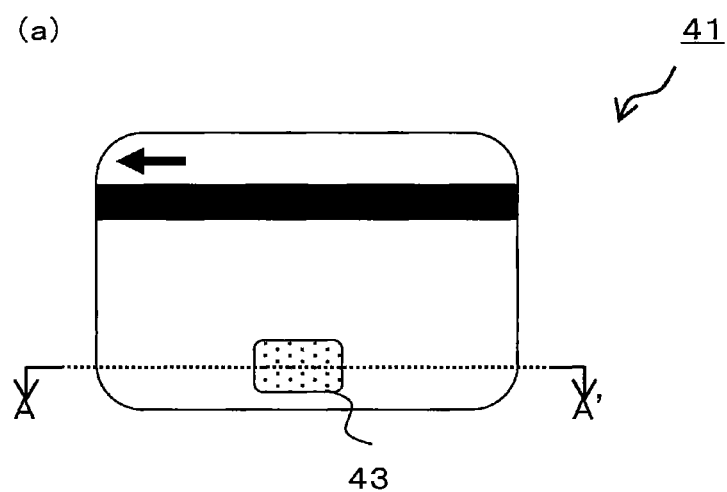
FIG. 6 (a) is a plan view of a card 41.
Figure 6:
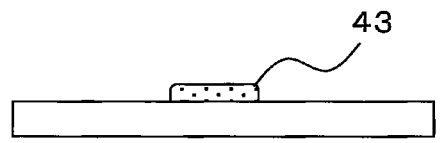
Figure 7:
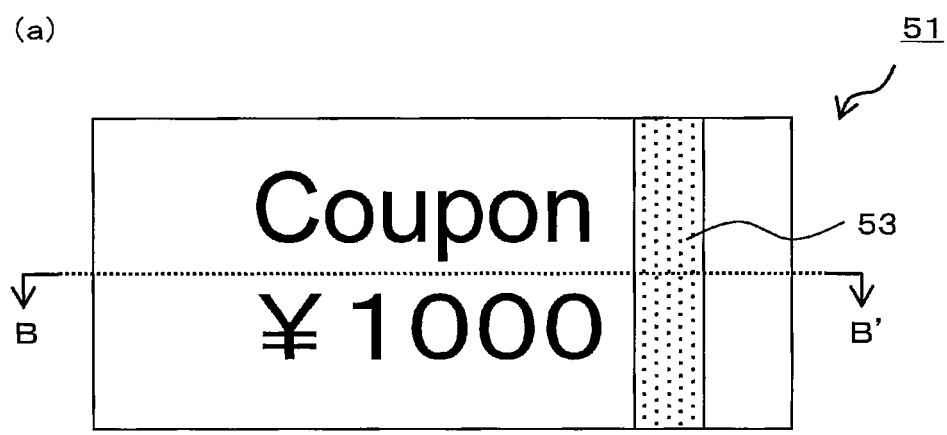
FIG. 7 (a) is a plan view of a valuable paper 51.
Figure 7:
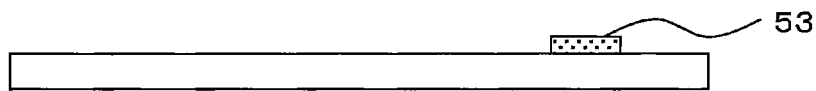

Also, the card 41 and the valuable paper 51 provided with the marker sheet 1 can be obtained by attaching the anti-counterfeiting label 21 or by heating and adhering the anti-counterfeiting transfer foil 31 to a card or valuable paper. For example, the card 41 has a marker sheet attached portion 43 as shown in FIG. 6 and the valuable paper 51 has a belt-like marker sheet attached portion 53. The marker sheet attached portions 43 and 53 are obtained by attaching the anti-counterfeiting label 21 or by heating and adhering the anti-counterfeiting transfer foil 31. A credit card, a cash card, an ID card, and a membership card are included as cards, and paper money, a stock certificate, a gift voucher, a lottery ticket, a bill, a check, and an admission ticket are included as valuable papers.

(A First Method for Manufacturing the Marker Sheet in Accordance with an Embodiment of the Present Invention)

Next, a first method for manufacturing the marker sheet in accordance with an embodiment of the present invention will be described.

Figure 8:
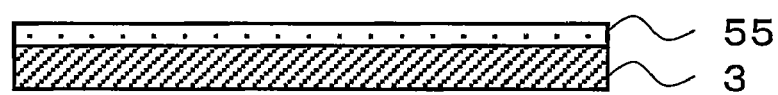
FIGS. 8 (a)-(c) are schematic sectional views illustrating a first manufacturing method for the marker sheet in accordance with an embodiment of the present invention.
Figure 8:
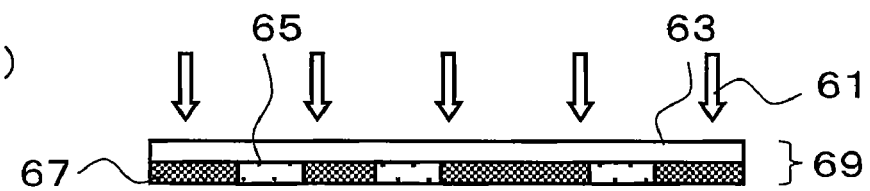
Figure 8:
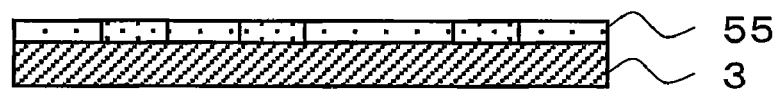
Figure 8:
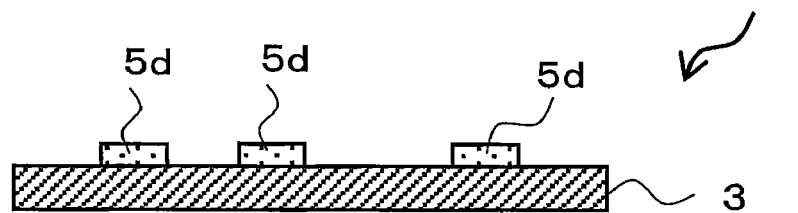

FIG. 8(*a*) illustrates an applying process. The applying process is a process in which photosensitive resin is applied on a substrate.

FIG. 8(*b*) illustrates an exposure process. The exposure process is a process in which the photosensitive resin layer is exposed to light through photo mask.

FIG. 8(*c*) illustrates an developing process. The developing process is a process in which the photosensitive resin layer is developed to form markers. The contour shapes of the markers formed, that are disposed irregularly on the substrate, can be recognized by magnified examination First, a negative photosensitive resin layer 55 is formed on the substrate 3 as shown in FIG. 8 (*a*).

The material for the negative photosensitive resin layer is not particularly limited, and generally used photosensitive resin can be used. Cross-linking resin based chemical amplification photosensitive resin, particularly the one made by adding a cross-linking agent and then an acid generator to polyvinyl phenol is an example. Acrylic negative photosensitive resin having photo-polymerization initiator which generates a radical component by irradiation of ultra-violet ray, a component including an acrylic group in its molecule and curable after polymerization by the generated radical component, and a component including an functional group—for example, an acid group in case of the development with acrylic solution—of which the un-exposed part can be dissolved after the development can also be used. Among the above-mentioned components having acrylic group, relatively low molecular weight multifunctional acrylic molecules are dipentaerythritol hexa-acrylate (DPHA), dipentaerythritol penta-acrylate (DPPA), tetramethyl pentatriacrylate (TMPTA), and the like. Also, high molecular weight multifunctional acrylic molecules are a polymer made by introducing an acrylic group to carboxylic acid, which is a part of a copolymer of styrene-acrylic acid-benzyl methacrylate through the medium of epoxy group, a copolymer of methyl-methacrylate-styrene-acrylic acid, and the like.

Then, as shown in FIG. 8 (*b*), the negative photosensitive resin layer 55 is exposed with a predetermined pattern through a photo mask 69 that has the predetermined pattern. The photo mask 69 has a light shielding film on a transparent base plate 63, a transmission part 65 that transmits exposure light 61, and a light shielding part 67 that hardly transmits the exposure light 61 because of the light shielding film. Since the negative photosensitive resin layer 55 is used, the photo mask 69 has the transmission part 65 at the regions corresponding to the markers 5*d*. In practice, the negative photosensitive resin layer 55 is prebaked and solidified before the exposure.

This exposure process of the negative photosensitive resin layer 55 with the predetermined pattern is not particularly limited but, other than the method using a photo mask as shown in FIG. 8 (*b*), a digital micro mirror device may be used for an exposure without using a photo mask. The digital micro mirror device (also called as digital mirror device or DMD) is an element having a plane on which a large number of micro mirrors that can be driven individually are arranged. The projection of the light for each of the display pixels can be controlled by individually driving each of the mirrors so that an exposure of the predetermined pattern without a photo mask is possible. Also, with the method using a photo mask, the pattern obtained by the exposure is always the same. Therefore, although different sheets that are cut out from the pattern are distinguishable, the number of distinguishable different marker sheets is limited since only a plurality of the same sets of the sheets are produced. On the other hand, with the method using the DMD, the pattern to be recorded can be varied each time resulting in a plurality of sets of the sheets obtained, and the number of distinguishable sheets increases remarkably.

Similarly, the number of distinguishable sheet can be increased by preparing a plurality of photo masks. Different patterns can be obtained by exposing a photo mask, and then exposing other photo masks at different angles and positions respectively from the first photo mask.

Also, in a case in which markers of different colors are to be formed on a film, a photosensitive resin of the first color is applied, exposed with the first photo mask, and then developed. After that, a photosensitive resin of the second color is applied, exposed with the second photo mask, and then developed. Here, the recorded patterns can be varied each time by changing the angle and the position of the second photo mask, increasing the number of distinguishable sheets.

Also, the number of distinguishable sheet can be increased by not using a plurality of photo masks but just one photo mask if the angle and the position of the photo mask in the exposure process are varied and exposed several times.

In addition to the method that uses a mask as shown in FIG. 8(b), the predetermined pattern can be exposed by using laser or electrical beam direct drawing.

Although negative photosensitive resin is used in FIG. 8(a) and FIG. 8(b), positive photosensitive resin may be used as well. In that case, the light shielding part 67 and the transmission part 65 replace one another and the light shielding part 67 is provided to the region that corresponds to the markers 5d.

The material for the positive photosensitive resin layer is not particularly limited either, and a generally used photosensitive resin can be used. Examples are novolac resin based chemical amplification photosensitive resin and the like.

After that, as shown in FIG. 8(c), markers 5d are formed by melting the negative photosensitive resin layer 55 with an alkaline developing solution and then patterning the photosensitive resin layer 55, producing a marker sheet 1a. Practically, the photosensitive resin layer 55 is rinsed several times after soaked in the developing solution, and then dried and post baked. Post baking makes the photosensitive resin more curable and enhances its adhesive property with the substrate.

The marker sheet 1a having a plurality of single colored marker 5d on the substrate 3 is obtained from the first manufacturing method of the present invention. Also, by changing the pattern of the photo mask 69, a marker sheet 1c having single colored markers 5d, 5g, 5h of different shapes can be obtained from this method.

A roll-to-roll photolithography device may be used for this first manufacturing method and the second and the third methods described below. A roll-to-roll photolithography device, which performs the processes of application, pre-baking, exposure, developing, rinsing, drying, post-baking, and the like while the substrate 3 is rolled out and passed continually until re-reeled, is suitable for mass production of the maker sheet 1.

(A Second Method for Manufacturing the Marker Sheet in Accordance with an Embodiment of the Present Invention)

Next, a second method for manufacturing the marker sheet in accordance with an embodiment of the present invention will be described. Unlike the first manufacturing method, the substrate 3 is operated on the base plate 57 in the second manufacturing method.

Figure 9:
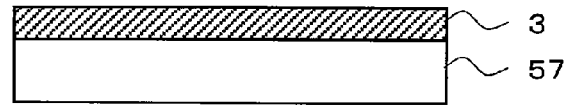
FIGS. 9 (a)-(e) are schematic sectional views illustrating a second manufacturing method for the marker sheet in accordance with an embodiment of the present invention.
Figure 9:
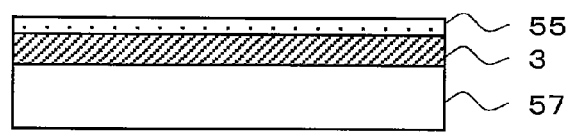
Figure 9:
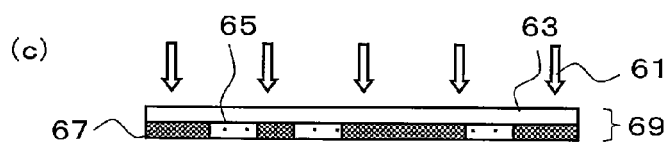
Figure 9:
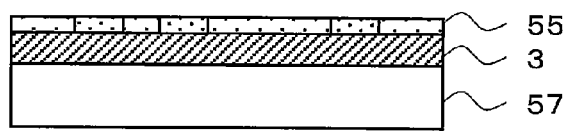
Figure 9:
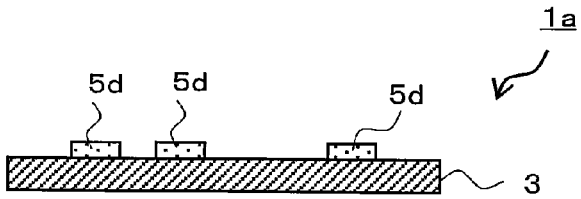

FIG. 9(a) shows a laminating process in which a substrate is laminated on a base plate.

FIG. 9(b) shows an applying process in which photosensitive resin is applied on the substrate.

FIG. 9(c) shows an exposure process in which the photosensitive resin is exposed through a photo mask.

FIG. 9(d) shows a developing process in which the photosensitive resin is developed to form markers. The markers formed are disposed irregularly and the contour shapes thereof are recognizable under magnified examination.

FIG. 9(e) shows a releasing process in which the substrate with the markers formed is released from the base.

First, as shown in FIG. 9(a), the substrate 3 is laminated on the base plate 57. If the substrate 3 is thin and lacks in rigidity, handling is sometimes difficult in the processes such as applying, exposure, and developing processes. Unifying the base plate 57 and the substrate 3 in the manufacturing process improves the handling.

The base plate 57 is not particularly limited but a flat base plate with rigidity to a certain extent can be used. For example, various types of glass plate, metal plate and resin plate may be used as the base plate 57.

Practically, to enhance the adhesion between the base plate 57 and the substrate 3, it is preferable to attach a re-releasable film, which has a weak and a strong adhering layers, on the base plate 57 with the weak adhering layer on top on which the substrate 3 is then attached.

Next, as shown in FIG. 9(b), the negative photosensitive resin layer 55 is formed on the substrate 3.

After that, as shown in FIG. 9(c), the negative photosensitive resin layer 55 is exposed with a predetermined pattern through the photo mask 69 having the predetermined pattern.

Then, as shown in FIG. 9(d), the negative photosensitive resin layer 55 is melted with developing solution and patterned to form the markers 5d.

After that, as shown in FIG. 9(e), the substrate 3 is released from the base plate 57 and the marker sheet 1a can be obtained.

The marker sheet 1a having a plurality of single colored marker 5d on the substrate 3 is obtained from the second manufacturing method of the present invention. Also, by changing the pattern of the photo mask 69, a marker sheet 1c having single colored markers 5d, 5g, 5h of different shapes can be obtained.

The marker sheet 1a can be obtained from the second manufacturing method of the present invention, even if the substrate 3 lacks in thickness and rigidity.

(A Third Method for Manufacturing the Marker Sheet in Accordance with an Embodiment of the Present Invention)

Next, a third method for manufacturing the marker sheet in accordance with an embodiment of the present invention will be described. In the third method, the manufacturing processes of applying, exposure, and developing of the first method are repeated for each color, changing the color of the negative photosensitive resin each time to obtain multi-colored marker sheet.

FIG. 10(a) shows a laminating process in which a substrate is laminated on a base plate.

FIG. 10(b) shows a first applying process in which photosensitive resin of first color is applied on the substrate.

FIG. 10(c) shows a first exposure process in which the photosensitive resin of the first color is exposed through a photo mask.

FIG. 10(d) shows a first developing process in which the photosensitive resin of the first color is developed to form markers of the first color.

FIG. 10(e) shows a second applying process in which photosensitive resin of second color is applied on the substrate.

Figure 11:
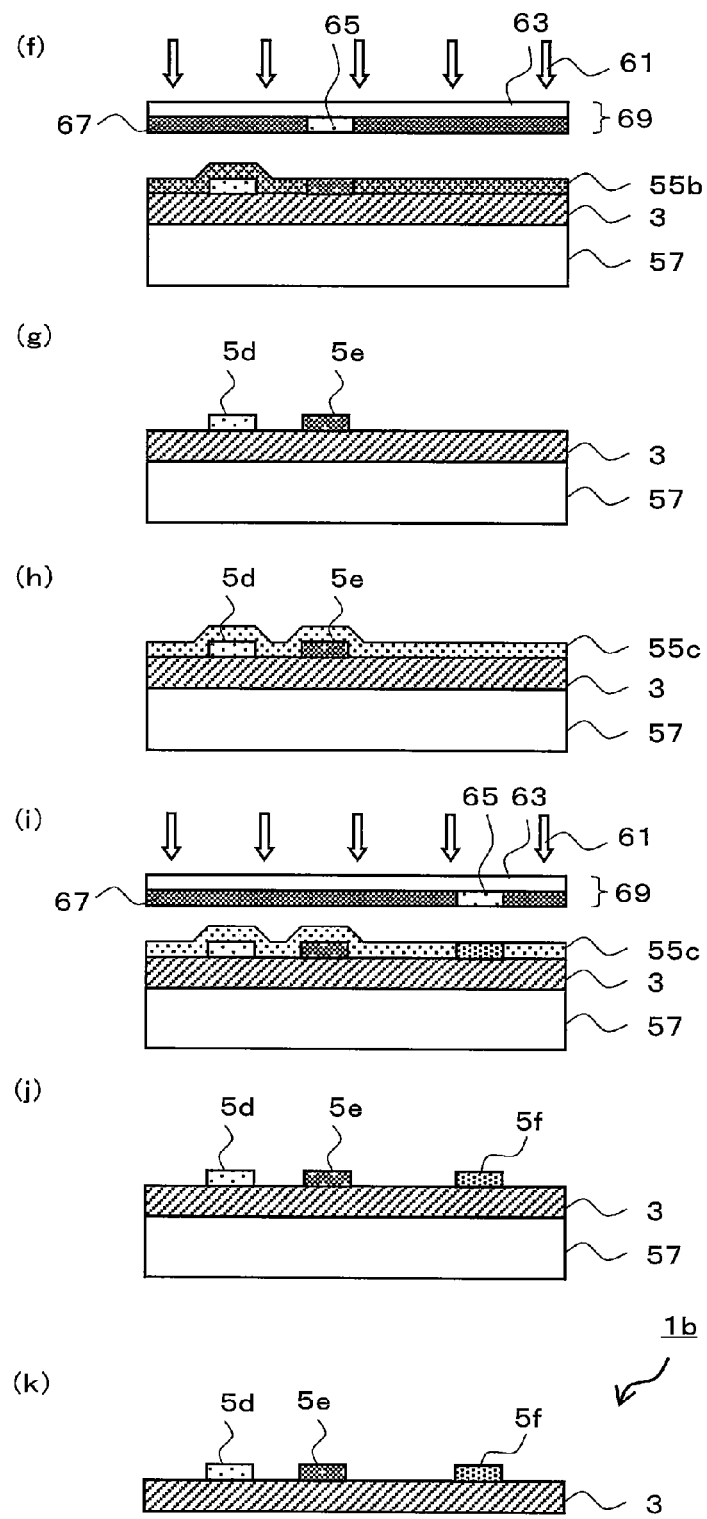
FIGS. 11 (f)-(k) are the continuation from FIGS. 10.

FIG. 11 (*f*) shows a second exposure process in which the photosensitive resin of the second color is exposed through a photo mask.

FIG. 11 (*g*) shows a second developing process in which the photosensitive resin of the second color is developed to form markers of the second color.

FIG. 11 (*h*) shows a third applying process in which photosensitive resin of third color is applied on the substrate.

FIG. 11 (*i*) shows a third exposure process in which the photosensitive resin of the third color is exposed through a photo mask.

FIG. 11 (*j*) shows a third developing process in which the photosensitive resin of the third color is developed to form markers of the third color.

FIG. 11 (*k*) shows a releasing process in which the substrate with the markers formed is released from the base.

The markers formed are disposed irregularly and the contour shapes thereof are recognizable under magnified examination.

Figure 10:
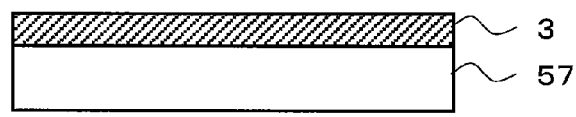
FIGS. 10 (a)-(e) are schematic sectional views illustrating a third manufacturing method for the marker sheet in accordance with an embodiment of the present invention.
Figure 10:
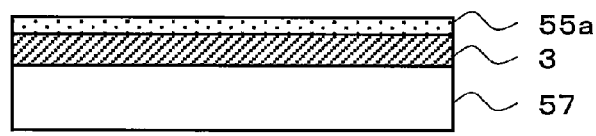
Figure 10:
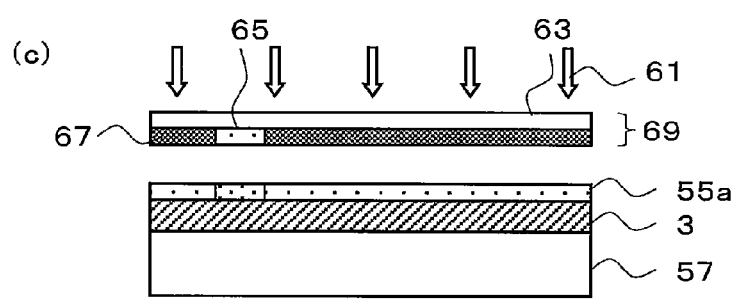
Figure 10:
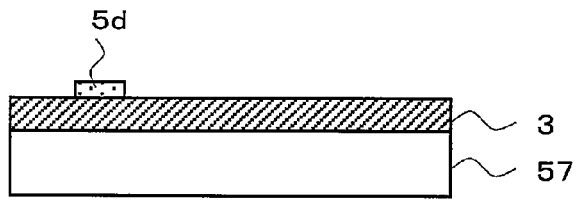
Figure 10:
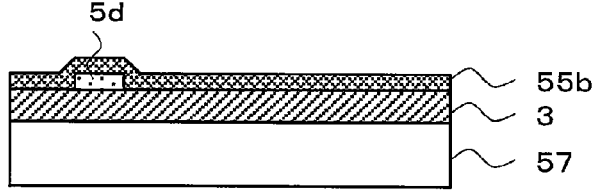

First, as shown in FIG. 10 (*a*), the substrate 3 is laminated on the base plate 57.

Next, as shown in FIG. 10 (*b*), a negative photosensitive resin layer 55*a* of the first color is formed on the substrate 3.

After that, as shown in FIG. 10 (*c*), the negative photosensitive resin layer 55*a* is exposed with a predetermined pattern through the photo mask 69 with a pattern having transmission parts 65 at the positions of markers 5*d*.

Then, as shown in FIG. 10 (*d*), the negative photosensitive resin layer 55*a* is melted with developing solution and patterned to form the markers 5*d*.

Next, as shown in FIG. 10 (*e*), a negative photosensitive resin layer 55*b* of the second color is formed on the substrate 3.

After that, as shown in FIG. 11(*f*), the negative photosensitive resin layer 55*b* is exposed with a predetermined pattern through the photo mask 69 with a pattern having transmission parts 65 at the positions of markers 5*e*.

Then, as shown in FIG. 11 (*g*), the negative photosensitive resin layer 55*b* is melted with developing solution and patterned to form the markers 5*e*.

Next, as shown in FIG. 11 (*h*), a negative photosensitive resin layer 55*c* of the third color is formed on the substrate 3.

After that, as shown in FIG. 11(*i*), the negative photosensitive resin layer 55*c* is exposed with a predetermined pattern through the photo mask 69 with a pattern having transmission parts 65 at the positions of markers 5*e*.

Then, as shown in FIG. 11 (*j*), the negative photosensitive resin layer 55*c* is melted with developing solution and patterned to form the markers 5*f*.

After that, as shown in FIG. 11 (*k*), the substrate 3 is released from the base plate 57 and the marker sheet 1*b* can be obtained.

The marker sheet 1*b* having a plurality of markers 5*d*, 5*e*, 5*f* of different colors on the substrate 3 is obtained from the third manufacturing method of the present invention. Also, by changing the pattern of the photo mask 69, the marker sheet 1 having markers 5*a* to 5*c* of different colors and shapes can be obtained from this method.

In FIG. 10 and FIG. 11, the processes of applying through to developing are repeated three times to obtain markers of three different colors. However, if two colors are sufficient, the processes are repeated only twice. And if four or more colors are required, the processes are repeated number of times corresponding to the number of colors.

Also, the substrate 3 is laminated on the base plate 57 in the third manufacturing method. However, if it is not necessary to use the base plate 57 in the manufacturing processes, the substrate 3 may not have to be laminated on the base plate 57.

(A Fourth Method for Manufacturing the Marker Sheet in Accordance with an Embodiment of the Present Invention)

Next, a fourth method for manufacturing the marker sheet in accordance with an embodiment of the present invention will be described. Unlike the first three manufacturing methods that use photolithography, markers are formed by printing in the fourth method.

Figure 12:
FIGS. 12 (a), (b) are schematic sectional views illustrating a fourth manufacturing method for the marker sheet in accordance with an embodiment of the present invention.
Figure 12:
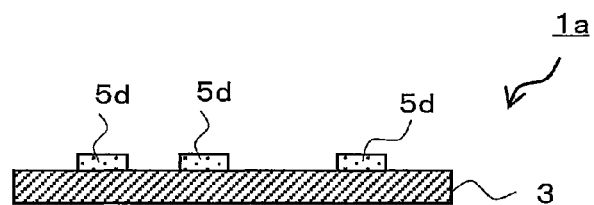

FIG. 12 (*a*) shows a substrate preparation process in which a substrate is prepared.

FIG. 12 (*b*) shows a printing process in which markers are printed on the substrate.

The markers formed are disposed irregularly and the contour shapes thereof are recognizable under magnified examination.

First, the substrate 3 is prepared as shown in FIG. 12 (*a*).

Next, the markers 5*d* are formed on the substrate 3 by printing as shown in FIG. 12 (*b*). This printing can be performed by silk screen printing, intaglio printing, or offset printing using a printing mask that is patterned after the shapes of the markers 5*d*. Another way to form the markers 5*d* is to directly print the markers 5*d* on the substrate without using a printing mask.

Ink used to print the markers 5*d* is not particularly limited but it is preferable to use water-resistant ink. Water-resistant ink is printing ink that uses organic solvents such as toluene, xylene, ethyl acetate, n-propyl acetate, methyl ethyl ketone (MEK), methyl isobutyl ketone (MIBK), isopropyl alcohol (IPA), ethanol, and n-propanol as solvents. This is because water-resistant ink is more durable than water-color ink so to prevent the marker sheets from deterioration in use.

The marker sheet 1*a* having a plurality of single colored markers 5*d* on the substrate 3 is obtained from the fourth manufacturing method of the present invention. Also, by changing the printing pattern of the shapes of the markers to be formed, the marker sheet 1*c* having single colored markers 5*d*, 5*g*, 5*g* of different shapes can be obtained from this method.

The marker sheet 1 or 1*b* having a plurality of markers of different colors can be obtained by repeating the printing process multiple times.

Generally, printing process has a feature that it is inexpensive compared to photolithography. Therefore, it is possible to manufacture low cost marker sheets by the fourth manufacturing method of the present invention compared to the first three manufacturing methods using photolithography.

EXAMPLES

Hereinafter, the present invention will be described concretely by showing examples.

Example 1

Manufacturing of the Marker Sheets (1) A re-releasing film (strong adhesive layer/PET/weak adhesive layer) is attached to a glass base plate on which a substrate (TEIJIN DU PONT FILMS' HPE-16 which is a PET film having a thickness of 16 μm) is then laminated.
(2) Negative photosensitive resin (DNP FINE CHEMICALS' IT-G R1501-5) including a red pigment is spin coated (for three seconds at 550 rpm, two seconds for slope) on the substrate and prebaked (for three minutes at 80° C.).
(3) The negative photosensitive resin layer is exposed to light (60 mJ) through a photo mask which has a light shielding film of chrome thin film and is patterned to produce irregularly disposed markers on the substrate.

(4) The negative photosensitive resin layer is developed for one minute in developing solution (HENKEL's Disperse H, diluted 100 times by water), rinsed with pure water, and then post baked (for 30 minutes at 150° C.) to obtain irregularly disposed red markers.

(5) Negative photosensitive resin (DNP FINE CHEMICALS' IT-G R1501-5) including a blue pigment is spin coated (for three seconds at 550 rpm, two seconds for slope) on the substrate on which the red markers are formed and prebaked (for three minutes at 80° C.).

(6) The negative photosensitive resin layer is exposed to light (60 mJ) through a photo mask that can form an arrangement that is different from the pattern used in (3).

(7) The negative photosensitive resin layer is developed for one minute in developing solution (Disperse H, diluted 100 times by water), rinsed with pure water, and then post baked (for 30 minutes at 150° C.) to obtain a marker sheet having irregularly disposed mixed markers of red and blue.

(8) Negative photosensitive resin (DNP FINE CHEMICALS' IT-G R1501-5) including a green pigment is spin coated (for three seconds at 550 rpm, two seconds for slope) on the substrate on which the red and blue markers are formed and prebaked (for three minutes at 80° C.).

(9) The negative photosensitive resin layer is exposed to light (60 mJ) through a photo mask that can form an arrangement that is different from the patterns used in (3) and (6).

(10) The negative photosensitive resin layer is developed for one minute in developing solution (Disperse H, diluted 100 times by water), rinsed with pure water, and then post baked (for 30 minutes at 150° C.) to obtain a marker sheet having irregularly disposed mixed markers of red, blue, and green.

(11) The marker sheet is released from the base plate (the glass base plate/re-releasing film) and the marker sheet is completed.

When the marker sheet manufactured by the manufacturing process described above is examined under a magnifying glass, unevenly and irregularly disposed markers that have various colors, shapes, and sizes can be recognized.

Example 2

Making a Label

Adhesive agent (LINTEC's Non carrier P1069) is applied on the surface of the completed marker sheet, on which the markers are formed, to make an anti-counterfeiting label.

When the completed anti-counterfeiting label is examined under a magnifying glass, evenly and irregularly disposed markers that have various colors, shapes, and sizes can be recognized.

Example 3

Making a Transfer Foil

Heat seal agent (CHUO RIKA Corp.'s EC1200) is applied on the surface of the completed marker sheet, on which the markers are formed, to make an anti-counterfeiting transfer foil.

When the completed anti-counterfeiting transfer foil is examined under a magnifying glass, evenly and irregularly disposed markers that have various colors, shapes, and sizes can be recognized.

Although the embodiments of the present invention have been described referring to the attached drawings, the technical scope of the present invention is not limited to the embodiments described above. It is obvious that persons skilled in the art can think out various examples of changes or modifications within the scope of the technical idea disclosed in the claims, and it will be understood that they naturally belong to the technical scope of the present invention.

EXPLANATION OF NUMERALS 1, 1a, 1b, 1c . . . marker sheet
3 . . . substrate
5, 5a, 5b, 5c, 5d, 5e, 5f, 5g, 5h, 5i . . . marker
7 . . . base plate
9 . . . penetration part
21 . . . anti-counterfeiting label
23 . . . adhesive layer
25 . . . releasing paper
31 . . . anti-counterfeiting transfer foil
33 . . . heat seal agent layer
35 . . . releasing paper
41 . . . card
43 . . . marker sheet attached portion
51 . . . valuable paper
53 . . . marker sheet attached portion
55 . . . negative photosensitive resin layer
57 . . . base plate
61 . . . exposure light
63 . . . transparent base plate
65 . . . transmission part
67 . . . light shielding part
69 . . . mask
71 . . . microscopic letter
73 . . . radius of curvature of a corner part

What is claimed is:

1. An anti-counterfeiting marker sheet comprising:
a resin film substrate; and
a plurality of markers that are formed directly on the resin film substrate by using photolithography, the markers comprising light-cured resin and having contour shapes that can be recognized by magnified examination,
wherein the entire plurality of markers is substantially evenly distributed on the resin film substrate, and the plurality of markers includes at least:
a first type of marker that is disposed on the resin film substrate so that the orientation, relative positions, and number density of the first type of marker are irregular; and
a second type of marker that is disposed on the resin film substrate so that the orientation, relative positions, and number density of the second type of marker are irregular.

2. The anti-counterfeiting marker sheet according to claim 1, wherein at least two of the markers have different colors than each other.

3. The anti-counterfeiting marker sheet according to claim 1,
wherein at least two of the markers have different contour shapes than each other.

4. The anti-counterfeiting marker sheet according to claim 1, wherein at least one of the markers defines a penetration region having a shape that can be recognized by magnified examination.

5. The anti-counterfeiting marker sheet according to claim 4, wherein the penetration region extends through the marker to two opposing surfaces of the marker.

6. The anti-counterfeiting marker sheet according to claim 1,
wherein at least one of the markers includes a rounded off corner part, and a minimum radius of curvature of the corner part in planar view is 250 nm or more and less than 10 µm.

7. The anti-counterfeiting marker sheet according to claim 1, wherein the resin film substrate is transparent.

8. The anti-counterfeiting marker sheet according to claim 1, wherein the resin film substrate is a resin film of polyethylene-terephthalate, polypropylene, polycarbonate, or polyethylene.

9. The anti-counterfeiting marker sheet according to claim 1, wherein the resin film substrate has a thickness of 100 µm or less.

10. An anti-counterfeiting function-imparting member comprising the anti-counterfeiting marker sheet according to claim 1, wherein the resin film substrate is laminated with at least an attachment layer and a release paper.

11. An anti-counterfeiting function-imparting member comprising:
the anti-counterfeiting marker sheet according to claim 1, wherein the resin film substrate is laminated with at least an attachment layer that is configured to attach the anti-counterfeiting marker sheet to an article.

12. The anti-counterfeiting marker sheet according to claim 11, wherein the resin film substrate is further laminated with a release paper.

13. An article provided with an anti-counterfeiting function, the article comprising the anti-counterfeiting marker sheet according to claim 1.

14. A manufacturing method for manufacturing an anti-counterfeiting marker sheet, the method comprising:
applying a photosensitive resin on a resin film substrate to form a photosensitive resin layer;
exposing the photosensitive resin layer to light through a photo mask; and
developing the photosensitive resin layer to form a plurality of markers of which the contour shapes can be recognized by magnifying examination,
wherein the entire plurality of markers is substantially evenly distributed on the resin film substrate, and the plurality of markers includes at least:
a first type of marker that is disposed on the resin film substrate so that the orientation, relative positions, and number density of the first type of marker are irregular; and
a second type of marker that is disposed on the resin film substrate so that the orientation, relative positions, and number density of the second type of marker are irregular.

15. The manufacturing method according to claim 14, comprising the steps of:
laminating the resin film substrate on a base plate before the applying step; and
releasing the resin film substrate, on which the markers are formed, from the base plate after the developing step.

16. The manufacturing method according to claim 14, wherein:
there are a plurality of colors of the markers; and
each of the applying, exposing, and developing steps are repeated with each color using a respectively colored photosensitive resin.

17. The manufacturing method according to claim 14, comprising:
repeating the exposing step with a plurality of photo masks, each of the plurality of photo masks being rotated at a different angle with respect to the photosensitive resin layer.

18. The manufacturing method according to claim 14, comprising:
repeating the exposing step with a plurality of photo masks, each of the plurality of photo masks being translated to a different position with respect to the photosensitive resin layer.

* * * * *